United States Patent
Gotz (10) Patent No.: US 10,715,362 B2
(45) Date of Patent: Jul. 14, 2020

(54) METHOD FOR INCREASING THE SIGNAL-TO-NOISE RATIO FOR COMMON-MODE INTERFERENCE ON A TWO-WIRE DATA BUS

(71) Applicant: Elmos Semiconductor Aktiengesellschaft, Dortmund (DE)

(72) Inventor: Marco Gotz, Radebeul (DE)

(73) Assignee: Elmos Semiconductor Aktiengesellschaft, Dortmund (DE)

( * ) Notice: Subject to any disclaimer, the term of this patent is extended or adjusted under 35 U.S.C. 154(b) by 145 days.

(21) Appl. No.: 15/998,645

(22) PCT Filed: Feb. 17, 2017

(86) PCT No.: PCT/EP2017/053681
§ 371 (c)(1),
(2) Date: Aug. 16, 2018

(87) PCT Pub. No.: WO2017/140884
PCT Pub. Date: Aug. 24, 2017

(65) Prior Publication Data
US 2020/0145263 A1    May 7, 2020

(30) Foreign Application Priority Data

Feb. 18, 2016 (DE) .......................... 10 2016 102 813
Feb. 18, 2016 (DE) .......................... 10 2016 102 814
(Continued)

(51) Int. Cl.
*H04L 25/08* (2006.01)
*H04B 3/50* (2006.01)
*H04L 25/02* (2006.01)

(52) U.S. Cl.
CPC ............. *H04L 25/085* (2013.01); *H04B 3/50* (2013.01); *H04L 25/0276* (2013.01); *H04L 25/0282* (2013.01)

(58) Field of Classification Search
CPC ............... H04L 25/085; H04L 25/0276; H04L 25/0282; H04B 3/50
See application file for complete search history.

(56) References Cited

U.S. PATENT DOCUMENTS 5,592,510 A    1/1997  Van Brunt et al.
5,825,819 A    10/1998 Cogburn
(Continued)

FOREIGN PATENT DOCUMENTS

DE   102009000697 A1   8/2010
DE   102014204048 A1   9/2015
(Continued)

OTHER PUBLICATIONS

International Search Report issued in Application No. PCT/EP2017/053681 dated Feb. 5, 2017, with English translation.

*Primary Examiner* — Kenneth T Lam
(74) *Attorney, Agent, or Firm* — Bejin Bieneman PLC (57) ABSTRACT

Data transmission method for a two-wire data bus from a transmitter having ports to a receiver having ports. The method comprises the steps of: detecting a first common-mode voltage swing on the ports and forming a first common-mode signal. Detecting a second common-mode voltage swing on the ports and forming a second common-mode signal. The transmitter sending data via the two-wire data bus. The receiver receiving the data. The voltage difference on the ports being compared with a lower and an upper reception threshold, wherein an output of an apparatus element assumes a first or second level on the basis of this comparison. Raising the differential send level if the absolute value of the first common-mode signal is greater than a (Continued)

first threshold value. Raising the upper reception threshold and/or lowering the lower reception threshold if the absolute value of the second common-mode signal is greater than a second threshold value. The method allows the transmission of a datum from the transmitter to the receiver. On the basis of the result of the comparison of the absolute value of the detected first common-mode signal with a first threshold value, the upper reception threshold is raised and/or the lower reception threshold is lowered whenever this absolute value of the first common-mode signal is greater than this first threshold value.

5 Claims, 2 Drawing Sheets

(30) Foreign Application Priority Data

| Feb. 18, 2016 | (DE) | 10 2016 102 815 |
| Feb. 18, 2016 | (DE) | 10 2016 102 816 |
| Nov. 22, 2016 | (DE) | 10 2016 122 449 |
| Nov. 22, 2016 | (DE) | 10 2016 122 450 |
| Nov. 22, 2016 | (DE) | 10 2016 122 451 |
| Nov. 22, 2016 | (DE) | 10 2016 122 452 |

(56) References Cited

U.S. PATENT DOCUMENTS

| 6,438,462 | B1 * | 8/2002 | Hanf | G06F 1/3203 |
| | | | | 340/693.4 |
| 8,891,595 | B1 | 11/2014 | Farjadrad et al. | |
| 2003/0085736 | A1 | 5/2003 | Tinsley et al. | |
| 2004/0246613 | A1 * | 12/2004 | Tseng | H03K 7/02 |
| | | | | 360/1 |
| 2009/0239559 | A1 * | 9/2009 | Hollis | H04L 25/0276 |
| | | | | 455/500 |
| 2010/0201399 | A1 | 8/2010 | Metzner et al. | |
| 2013/0010892 | A1 * | 1/2013 | Cronie | H04L 25/0276 |
| | | | | 375/296 |
| 2013/0332463 | A1 * | 12/2013 | Roberts | H04N 21/2543 |
| | | | | 707/741 |
| 2016/0261426 | A1 * | 9/2016 | Vandersteegen | H04L 61/2038 |
| 2017/0063571 | A1 | 3/2017 | Hehemann et al. | |
| 2017/0106815 | A1 * | 4/2017 | Csabai | B60D 1/62 |
| 2018/0198481 | A1 * | 7/2018 | Bavois | H04L 12/40032 |

FOREIGN PATENT DOCUMENTS

| DE | 102016122449 B3 | 5/2017 |
| DE | 102016122450 B3 | 5/2017 |
| DE | 102016122451 B3 | 5/2017 |
| DE | 102016122452 B3 | 5/2017 |
| EP | 2282406 A2 | 2/2011 |

* cited by examiner

METHOD FOR INCREASING THE SIGNAL-TO-NOISE RATIO FOR COMMON-MODE INTERFERENCE ON A TWO-WIRE DATA BUS

This application is a national stage of International Appliction No. PCT/EP2017/053681, filed Feb. 17, 2017, which claims the priorities of the German Patent Applications 10 2016 102 813.4 of Feb. 18, 2016, 10 2016 102 815.0 of Feb. 18, 2016, 10 2016 102 814.2 of Feb. 18, 2016, 10 2016 102 816.9 of Feb. 18, 2016, 10 2016 122 450.2 of Nov. 22, 2016, 10 2016 122 449.9 of Nov. 22, 2016, 10 2016 122 452.9 of Nov. 22, 2016 and 10 2016 122 451.0 of Nov. 22, 2016, the contents of said applications being herewith included, by way of reference, in the subject matter of the present patent application.

The invention relates to methods and devices for increasing the signal-to-noise ratio in case of common-mode interferences on a two-wire data bus.

In the digital transmission of data in two-wire data buses, it is a permanent problem that, due to irradiation from outside, a common-mode swing is generated on the two data bus lines of a two-wire data bus line, wherein this common-mode swing may lead to distortion of the input signal and thus to corruption of received data when, because of this common-mode swing, the input stages enter a saturated state. This situation is particularly critical in automobile data busses such as e.g. the Flexray data bus.

From DE-A-10 2014 204 048, there is known a subscriber station for a bus system that comprises an emission control system for control of the properties of the transmitter/receiver device in order to reduce the wire-bound emissions in the respective bus system. Thus, the subject matter of the present document pertains only to emissions of the bus system toward the outside but not, however, to an increase of the robustness in the reverse direction, i.e. against irradiation from outside.

From DE-A-10 2009 000 697, a driver circuit for a two-wire line is known that evaluates the voltage on the two-wire line and, optionally, applies an error signal upon occurrence of faulty states. Optionally, the output current of the driver circuit is readjusted.

From U.S. Pat. No. 5,825,819, there is known a driver with common-mode suppression by means of a feedback loop. The feedback loop, however, is permanently active also during normal operation and thus takes an influence on the normal operation. It is, however, also desired to be able to handle events that bring the system into a non-specification-compliant state, without adversely affecting the normal operation by such a common-mode suppression in a non-specification-compliant manner.

From US-A-2003/0 085 736, a further common-mode suppression is known that is active during normal operation.

From U.S. Pat. No. 5,592,510, there is known a driver for a twisted-pair line that actively reduces the common-mode current in a two-wire bus line. Also this common-mode suppression is active during normal operation.

In the state of the art, these common-mode suppressions are burdensome to the transmitter and receiver devices in undisturbed normal operation. When a non-specification-compliant interference occurs, such a transmission system is desired to behave in the most robust manner possible against such interferences—which, actually, already per se violate the specification.

It is an object of the invention to detect a critical common-mode interference and, by additional measures that are preferably taken simultaneously but do not necessarily have to be synchronous, to increase the signal-to-noise ratio for data transmission.

The invention according to the variants detailed hereunder is based on the common concept that, in case of a common-mode interference of the two-wire data bus, there will be increased, on the transmitter side, the (differential) signal level or, on the receiver side, there will be decreased the sensitivity to common-mode interferences, or both of these measures will be initiated.

According to a first variant, the above object is achieved, as provided by the invention, by a method wherein the detection of a too large common-mode voltage swing is performed by the transmitter, namely by a method for transmission of data (d) by means of digital voltage signals via a two-wire data bus (Z) of a vehicle from a transmitter (S) to a receiver (E) under the influence of common-mode interferences acting on the two-wire data bus (Z), wherein the two-wire data bus (Z) comprises a first data bus line (d1) and a second data bus line (d2), wherein the transmitter (S) comprises a first connecting point (A1) connected to the first data bus line (d1) and a second connecting point (A2) connected to the second data bus line (d2), and a first reference potential connecting point (BP1), wherein the transmitter (S) comprises a first driver (D1) for the first connecting point (A1) and a second driver (D2) for the second connecting point (A2), and wherein the receiver (E) comprises a third connecting point (A3) connected to the first data bus line (d1) and a fourth connecting point (A4) connected to the second data bus line (d2), and a second reference potential connecting point (BP2), comprising the following steps:

a) detection of a first common-mode voltage swing at the first and the second connecting point (A1,A2) of the transmitter (S) relative to the first reference potential connecting point (BP1), and forming a first common-mode signal (k1), b) transmission of data (d) by the transmitter (S) via the two-wire data bus (Z) to the receiver (E) by applying, between the first and the second connecting point (A1,A2) of the transmitter (S), a digital voltage signal having a differential transmission level,
  i) wherein the first driver (D1) drives the first data line (d1) with a first offset (O1) and a first voltage level (P1),
  ii) wherein the second driver (D2) drives the second data line (d2) with a second offset (O2) and a second voltage level (P2), and
  iii) wherein the differential transmission level is the difference of the first voltage level (P1) and the second voltage level (P2)

c) reception of the data by the receiver (E) by detection of the voltage differences between the third connecting point (A3) and the fourth connecting point (A4) of the receiver (E), and d) comparison of the amount of the detected first common-mode voltage swing to a first threshold value (SW1) and (particularly on the transmitter side) increasing the differential transmission level if the amount of the first common-mode voltage swing is larger than the first threshold value (SW1).

According to a second variant, the above object is achieved, as provided by the invention, by a method wherein the detection of a too large common-mode voltage swing is performed by the receiver which comprises a comparator for comparison of the common-mode swing to a threshold value, namely by a method for transmission of data (d) by means of digital voltage signals via a two-wire data bus (Z) of a vehicle from a transmitter (S) to a receiver (E) under the influence of common-mode interferences acting on the two-wire data bus (Z), wherein the two-wire data bus (Z) comprises a first data bus line (d1) and a second data bus line (d2), wherein the transmitter (S) comprises a first connecting point (A1) connected to the first data bus line (d1) and a second connecting point (A2) connected to the second data bus line (d2), and a first reference potential connecting point (BP1), and wherein the receiver (E) comprises a third connecting point (A3) connected to the first data bus line (d1) and a fourth connecting point (A4) connected to the second data bus line (d2), and a second reference potential connecting point (BP2), comprising the following steps:

a) detection of a second common-mode voltage swing at the third and the fourth connecting point (A3,A4) of the receiver (E) relative to the second reference potential connecting point (BP2), and forming a second common-mode signal (k1), b) transmission of data (d) by the transmitter (S) via the two-wire data bus (Z) to the receiver (E) by applying, between the first and the second connecting point (A1,A2) of the transmitter (S), a digital voltage signal for generating voltage differences (over time) between the connecting points, c) reception of the data by the receiver (E) by detection of the voltage differences between the third connecting point (A3) and the fourth connecting point (A4) of the receiver (E), d) comparison of the voltage differences existing between the third and the fourth connecting point (A3,A4) of the receiver (E) to a third threshold value (SW3), wherein a first logical value is assigned to voltage differences above said third threshold value (SW3), and a second logical value that is inverted to the first logical value is assigned to voltage differences below said third threshold value (SW3), and e) comparison of the amount of the detected second common-mode voltage swing to a second threshold value (SW2) and (particularly on the receiver side) increasing the third threshold value (SW3) if the amount of the second common-mode voltage swing is larger than the second threshold value (SW2).

According to a third variant, the above object is achieved, as provided by the invention, by a method wherein the detection of a too large common-mode voltage swing is performed both by the transmitter and by the receiver which comprises a comparator for comparison of the common-mode, namely by a method for transmission of data (d) by means of digital voltage signals via a two-wire data bus (Z) of a vehicle from a transmitter (S) to a receiver (E) under the influence of common-mode interferences acting on the two-wire data bus (Z), wherein the two-wire data bus (Z) comprises a first data bus line (d1) and a second data bus line (d2), wherein the transmitter (S) comprises a first connecting point (A1) connected to the first data bus line (d1) and a second connecting point (A2) connected to the second data bus line (d2), and a first reference potential connecting point (BP1), wherein the transmitter (S) comprises a first driver (D1) for the first connecting point (A1) and a second driver (D2) for the second connecting point (A2), and wherein the receiver (E) comprises a third connecting point (A3) connected to the first data bus line (d1) and a fourth connecting point (A4) connected to the second data bus line (d2), and a second reference potential connecting point (BP2), comprising the following steps:

a) detection of a first common-mode voltage swing at the first and the second connecting point (A1,A2) of the transmitter (S) relative to the first reference potential connecting point (BP1), and forming a first common-mode signal (k1), b) detection of a second common-mode voltage swing at the third and the fourth connecting point (A3,A4) of the receiver (E) relative to the second reference potential connecting point (BP2), and forming a second common-mode signal (k2), c) transmission of data (d) by the transmitter (S) via the two-wire data bus (Z) to the receiver (E) by applying, between the first and the second connecting point (A1,A2) of the transmitter (S), a digital voltage signal having a differential transmission level,
  i) wherein the first driver (D1) drives the first data line (d1) with a first offset (O1) and a first voltage level (P1),
  ii) wherein the second driver (D2) drives the second data line (d2) with a second offset (O2) and a second voltage level (P2), and
  iii) wherein the differential transmission level is the difference of the first voltage level (P1) and the second voltage level (P2)

d) reception of the data by the receiver (E) by detection of the voltage differences between the third connecting point (A3) and the fourth connecting point (A4) of the receiver (E), e) comparison of the voltage differences existing between the third and the fourth connecting point (A3,A4) of the receiver (E) to a third threshold value (SW3), wherein a first logical value is assigned to voltage differences above said third threshold value (SW3), and a second logical value that is inverted to the first logical value is assigned to voltage differences below said third threshold value (SW3), f) comparison of the amount of the detected first common-mode voltage swing to a first threshold value (SW1) and (particularly on the transmitter side) increasing the differential transmission level if the amount of the first common-mode voltage swing is larger than the first threshold value (SW1), g) comparison of the amount of the detected second common-mode voltage swing to a second threshold value (SW2) and (particularly on the receiver side) increasing the third threshold value (SW3) if the amount of the second common-mode voltage swing is larger than the second threshold value (SW2), and h) transmission of a data value from the transmitter (S) to the receiver (E) that is dependent on the result of the comparison of the amount of the detected first common-mode voltage swing to the first threshold value (SW1) (i.e. that represents in a qualitative manner whether the amount of the detected first common-mode voltage swing is larger or smaller than the first threshold value (or equal to the first threshold value) or that, additionally, also represents in a quantitative manner the magnitude between both of these) and (particularly on the receiver side) increasing the third threshold value (SW3) if the amount of the first common-mode voltage swing is larger than the first threshold value (SW1).

According to a fourth variant, the above object is achieved, as provided by the invention, by a method wherein the detection of a too large common-mode voltage swing is performed by the transmitter, wherein the receiver comprises a Schmitt trigger for comparison of the common-mode, namely by a method for transmission of data (d) by means of digital voltage signals via a two-wire data bus (Z) of a vehicle from a transmitter (S) to a receiver (E) under the influence of common-mode interferences acting on the two-wire data bus (Z), wherein the two-wire data bus (Z) comprises a first data bus line (d1) and a second data bus line (d2),
wherein the transmitter (S) comprises a first connecting point (A1) connected to the first data bus line (d1) and a second connecting point (A2) connected to the second data bus line (d2), and a first reference potential connecting point (BP1),
wherein the receiver (E) comprises a third connecting point (A3) connected to the first data bus line (d1) and a fourth connecting point (A4) connected to the second data bus line (d2), and a second reference potential connecting point (BP2),
comprising the following steps:
a) detection of a second common-mode voltage swing at the third and the fourth connecting point (A3,A4) of the receiver (E) relative to the second reference potential connecting point (BP2), and forming a second common-mode signal (k2),
b) transmission of data (d) by the transmitter (S) via the two-wire data bus (Z) to the receiver (E) by applying, between the first and the second connecting point (A1,A2) of the transmitter (S), a digital voltage signal for generating voltage differences (over time) between these,
c) reception of the data by the receiver (E) by detection of the voltage differences between the third connecting point (A3) and the fourth connecting point (A4) of the receiver (E),
d) comparison of the voltage differences existing between the third and the fourth connecting point (A3,A4) of the receiver (E) to a lower reception threshold (SW4), wherein, in case of voltage differences below said lower reception threshold (SW4), an output (O) of a partial device (CMP3) performing the comparison assumes a first level having a first logical value assigned to it, and to an upper reception threshold (SW5), wherein, in case of voltage differences above said upper reception threshold (SW5), a/the output (O) of a/the partial device (CMP3) performing the comparison assumes a second level having a second logical level assigned to it that is complementary to the first logical value,
e) comparison of the amount of the detected second common-mode voltage swing to a second threshold value (SW2) and (particularly on the receiver side) increasing the upper reception threshold (SW5) and decreasing the lower reception threshold (SW4) if the amount of the second common-mode voltage swing is larger than the second threshold value (SW2).

According to a fifth variant, the above object is achieved, as provided by the invention, by a method wherein the detection of a too large common-mode voltage swing is performed both by the transmitter and the receiver, wherein the receiver comprises a Schmitt trigger for comparison of the common-mode, namely by a method for transmission of data (d) by means of digital voltage signals via a two-wire data bus (Z) of a vehicle from a transmitter (S) to a receiver (E) under the influence of common-mode interferences acting on the two-wire data bus (Z), wherein the two-wire data bus (Z) comprises a first data bus line (d1) and a second data bus line (d2),
wherein the transmitter (S) comprises a first connecting point (A1) connected to the first data bus line (d1) and a second connecting point (A2) connected to the second data bus line (d2), and a first reference potential connecting point (BP1),
wherein the transmitter (S) comprises a first driver (D1) for the first connecting point (A1) and a second driver (D2) for the second connecting point (A2), and
wherein the receiver (E) comprises a third connecting point (A3) connected to the first data bus line (d1) and a fourth connecting point (A4) connected to the second data bus line (d2), and a second reference potential connecting point (BP2),
comprising the following steps:
a) detection of a first common-mode voltage swing at the first and the second connecting point (A1,A2) of the transmitter (S) relative to the first reference potential connecting point (BP1), and forming a first common-mode signal (k1),
b) detection of a second common-mode voltage swing at the third and the fourth connecting point (A3,A4) of the receiver (E) relative to the second reference potential connecting point (BP2), and forming a second common-mode signal (k2),
c) transmission of data (d) by the transmitter (S) via the two-wire data bus (Z) to the receiver (E) by applying, between the first and the second connecting point (A1,A2) of the transmitter (S), a digital voltage signal having a differential transmission level,
  i) wherein the first driver (D1) drives the first data line (d1) with a first offset (O1) and a first voltage level (P1),
  ii) wherein the second driver (D2) drives the second data line (d2) with a second offset (O2) and a second voltage level (P2), and
  iii) wherein the differential transmission level is the difference of the first voltage level (P1) and the second voltage level (P2),
d) reception of the data by the receiver (E) by detection of the voltage differences (over time) between the third connecting point (A3) and the fourth connecting point (A4) of the receiver (E),
e) comparison of the voltage differences existing between the third and the fourth connecting point (A3,A4) of the receiver (E) to a lower reception threshold (SW4), wherein, in case of voltage differences below said lower reception threshold (SW4), an output (O) of a partial device (CMP3) performing the comparison assumes a first level having a first logical value assigned to it, and to an upper reception threshold (SW5), wherein, in case of voltage differences above said upper reception threshold (SW5), a/the output (O) of a/the partial device (CMP3) performing the comparison assumes a second level having a second logical level assigned to it that is complementary to the first logical value,
f) comparison of the amount of the detected first common-mode voltage swing to a first threshold value (SW1) and (particularly on the transmitter side) increasing the differential transmission level if the amount of the first common-mode voltage swing is larger than the first threshold value (SW1), g) comparison of the amount of the detected second common-mode voltage swing to a second threshold value (SW2) and (particularly on the receiver side) increasing the upper reception threshold (SW5) and decreasing the lower reception threshold (SW4) if the amount of the second common-mode voltage swing is larger than the second threshold value (SW2), and h) transmission of a data value from the transmitter (S) to the receiver (E) that is dependent on the result of the comparison of the amount of the detected first common-mode voltage swing to the first threshold value (SW1) (i.e. that represents in a qualitative manner whether the amount of the detected first common-mode voltage swing is larger or smaller than the first threshold value (or equal to the first threshold value) or that, additionally, also represents in a quantitative manner the magnitude between both of these), and (particularly on the receiver side) increasing the upper reception threshold (SW5) and decreasing the lower reception threshold (SW4) if the amount of the first common-mode voltage swing is larger than the first threshold value (SW1).

Exemplary embodiments of the invention are shown in FIGS. 1 and 2.

The data bus system of the invention is provided for transmission of data d by means of digital voltage signals via a two-wire data bus Z of in an automobile from a transmitter S to a receiver E.

The inventive suppression of common-mode interferences is based on the idea that, by means of a second common-mode detector DT2 on the side of the receiver E or by means of a first common-mode detector DT1 on the side of the transmitter S or by means of both common-mode detectors DT1,DT2, the common-mode behavior of the two-wire data bus Z will be monitored directly at the receiver E by measuring the common-mode values on the transmitter and/or receiver side, the existence of a common-mode interference will be detected and countermeasures will be initiated. Here, it is to be noted that, in case of such a critical common-mode interference that impedes the correct reception of the data on the two-wire data bus Z, the two-wire data bus Z is, typically, already not in a specification-compliant state anymore. Thus, it is not the objective of the measures to restore the specification-compliant state on the two-wire data bus Z, but to render possible the continued correct reception of the data and transmission of the data in spite of a deviation from the specification without reducing the reception quality for other bus participants. Thus, the initiated countermeasures are not to be assumed as specification-compliant for all two-wire data busses but have to be adapted from case to case and from bus specification to bus specification. A sufficiently strong common-mode interference will bring the two-wire data bus Z into a non-specification-compliant state. Top priority is to be given in each case to the restoration of a correct data reception under these externally imposed operational conditions, and not to the restoration of the specification-compliant operational conditions.

Both common-mode detectors DT1,DT2 are preferably fixedly connected to a reference potential BP1,BP2 and will monitor the common-mode signal on the data bus line d1,d2 preferably by capacitive coupling.

The transmitter S comprises a first connecting point A1 for connection to a first data bus line d1 of the two-wire data bus Z and a second connecting point A2 for connection to a second data bus line d2 of the two-wire data bus Z, and a first reference potential connecting point BP1.

The receiver E comprises a third connecting point A3 for connection to the first data bus line d1 of the two-wire data bus Z and a fourth connecting point A4 for connection to the second data bus line d2 of the two-wire data bus Z, and a second reference potential connecting point BP2.

The transmitter S further comprises a partial device C1,C2 that detects the first common-mode voltage swing at the first connecting point A1 and at the second connecting point A2 relative to the first reference potential connecting point BP1 and generates a first common-mode signal k1.

The receiver E further comprises a partial device C3,C4 that detects the second common-mode voltage swing at the third connecting point A3 and at the fourth connecting point A4 relative to the second reference potential connecting point BP2 and generates a second common-mode signal k2.

The transmitter S comprises a first driver D1 that, for transmission of data d by means of a digital differential voltage signal via the two-wire data bus Z, is connected to the first connecting point A1 and thus to the first data line d1 of the two-wire data bus Z. The first driver D1 controls the first data line d1 of the two-wire data bus Z by means of a signal having a first voltage level P1 and a first offset O1. In this context, the first voltage level P1 corresponds to the signal amplitude, and the first offset O1 corresponds to a first offset voltage by which the signal on the first data line d1 of the two-wire data bus Z is then additively lowered or raised toward the reference potential.

The transmitter S further comprises a second driver D2 that, for transmission of data d by means of a digital differential voltage signal via the two-wire data bus Z, is connected to the second connecting point A2 and thus to the second data line d2 of the two-wire data bus Z. The second driver D2 controls the second data line d2 of the two-wire data bus Z by means of a signal having a second voltage level P2 and a second offset O2. In this context, the second voltage level P2 corresponds to the signal amplitude, and the second offset O2 corresponds to a second offset voltage by which the signal on the second data line d2 of the two-wire data bus Z is then additively lowered or raised toward the reference potential.

Within receiver E, there is arranged a receiver device, particularly a Schmitt trigger CMP2, that receives the data d transmitted by the transmitter onto the two-wire data bus Z, namely by detection of the voltage difference between a third connecting point A3 having the first data bus line d1 connected to it, and a fourth connecting point A4 having the second data bus line d2 connected to it.

Thus, according to the invention, both the receiver E and the transmitter S monitor the two-wire data bus Z for common-mode interferences. When, by means of the first common-mode detector DT1 of the transmitter S, a common-mode interference is detected on the two-wire data bus Z, the transmitter S will increase its transmission level. When, by means of the second common-mode detector DT2 of the side of the receiver E, a common-mode interference is detected, the receiver E will increase its upper reception threshold SW5 and decrease its lower reception threshold SW4 for the differentiation between the two logical levels so that the signal-to-noise ratio will be increased. In this context, the lower reception threshold SW4 and the upper reception threshold SW5 are e.g. the reception threshold values of a Schmitt trigger circuit CMP3 that will evaluate the differential voltage level on the two-wire data bus Z. Of course, it is also possible here, when using a simple comparator CMP2, to operate only with a sole threshold value SW3.

In this regard, a synchronous increase of the distance of the upper and the lower reception thresholds SW3,SW4 on the side of the receiver E with an increase of the first voltage level P1 and the second voltage level P2 on the side of the transmitter S is not unconditionally required.

It is of importance that, in case of a reception disturbed by a common-mode interference, the receiver E does not increase the distance between the upper and the lower reception thresholds SW4,SW5 for reception to such an extent that the upper and the lower reception thresholds SW4,SW5 would lie above a (still) specification-compliant value.

Figure 1:
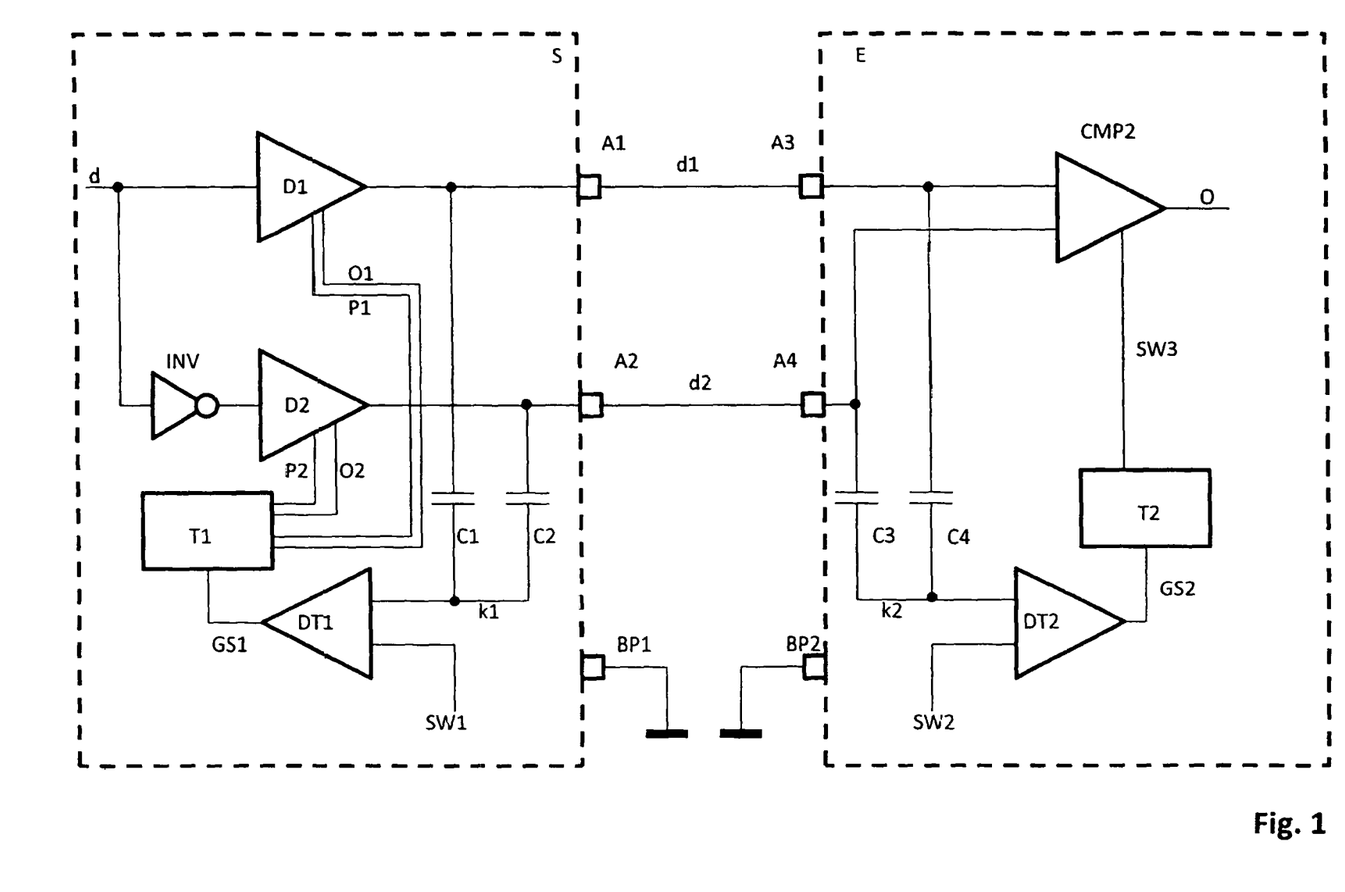

Thus, a device is operative to perform a method for transmission of data by means of digital voltage signals on a two-wire data bus Z in an automobile. In the process, the digital voltage signals can only assume, between two threshold values, a finite number of values. In so far, a binary signal is to be considered as being a special case of a digital signal since it is a two-stage digital signal that can assume only two values. According to the invention, data are to be transmitted from a transmitter S to a receiver E preferably as a differential voltage signal. In this regard, the transmitter S comprises a first connecting point A1 that is connected to the first data bus line d1 of the two-wire data bus Z, and the second connecting point A2 that is connected to a second data bus line d2 of the two-wire data bus Z, and a first reference potential connecting point BP1 on the transmitter side that, by a preferably fixed voltage relationship, is connected to the second reference potential connecting point BP2 of the receiver E. Preferably, there exists herein a common reference mass that, with respect to the voltage, should deviate as little as possible. The receiver E on the other side of the data bus line d1,d2 comprises the third connecting point A3 that is connected to the first data bus line d1 of the two-wire data bus Z, and the fourth connecting point A4 that is connected to the second data bus line d2 of the two-wire data bus Z, and said second reference potential connecting point BP2. The two-wire data bus system will now perform the following inventive method for increasing the signal-to-noise ratio of the data transmission:

A possibly occurring first common-mode voltage swing at the first and the second connecting point A1,A2 of the transmitter S relative to the first reference potential connecting point BP1 will be detected by the first common-mode detector DT1 which preferably is a part of the transmitter S. Preferably, this is an average value of the voltage at the first connecting point A1 and the second connecting point A2. In the example according to FIG. 1, this average value is formed, by a preferably capacitive voltage divider consisting of the first capacitor C1 and the second capacitor C2, or a different voltage divider, from the potential of the first data bus line d1 and the potential of the second data bus line d2, namely as a first common-mode signal k1.

A possibly occurring second common-mode voltage swing at the third and the fourth connecting point A3,A4 of the receiver E relative to the second reference potential connecting point BP2 will be detected by the second common-mode detector DT2. Preferably, this is an average value of the voltage at the third connecting point A3 and the fourth connecting point A4. In the example according to FIG. 1, this average value is formed, by a preferably capacitive voltage divider or a different voltage divider consisting of the third capacitor C3 and the fourth capacitor C4, from the potential of the first data bus line d1 and the potential of the second data bus line d2, namely as a second common-mode signal k2.

The transmitter S transmits data with a differential transmission level by means of a digital voltage signal between the first connecting point A1 and the second connecting point A2 of the transmitter S via the two-wire data bus. Herein, the differential transmission level is the voltage difference between a first voltage level P1 by which the first driver D1 of the transmitter S drives the first data bus line d1, and a second voltage level P2 by which the second driver D2 of the transmitter S drives the second data bus line d2.

The receiver E receives the data by measurement of the voltage difference between its third and its fourth connecting point A3,A4 and by subsequent comparison of this measured voltage difference to a third threshold value. In the example according to FIG. 1, the comparison to the third threshold value SW3 is realized by means of a receiver-side comparator CMP2 while, in the example according to FIG. 2, use is made of a Schmitt trigger CMP3 instead of a receiver-side comparator. Accordingly, the voltage difference between the third and the fourth connecting point A3,A4 is compared to a lower reception threshold SW4 of the Schmitt trigger CMP3 of the receiver E and to an upper reception threshold SW4 of the Schmitt trigger CMP2 of the receiver E. Thus, in the exemplary embodiment according to FIG. 2, the third threshold value SW3 of the exemplary embodiment according to FIG. 1 has its correspondence in the lower and upper reception thresholds SW4 and SW5. Thus, in general terms, the voltage difference between the third and the fourth connecting point A3,A4 of the receiver E is examined as to whether it falls short of a lower reception threshold SW4 and respectively exceeds an upper reception threshold SW5 (see FIG. 2), wherein these two reception thresholds SW4,SW5 may coincide and thus form the third threshold value SW3 of the exemplary embodiment according to FIG. 1.

Figure 2:
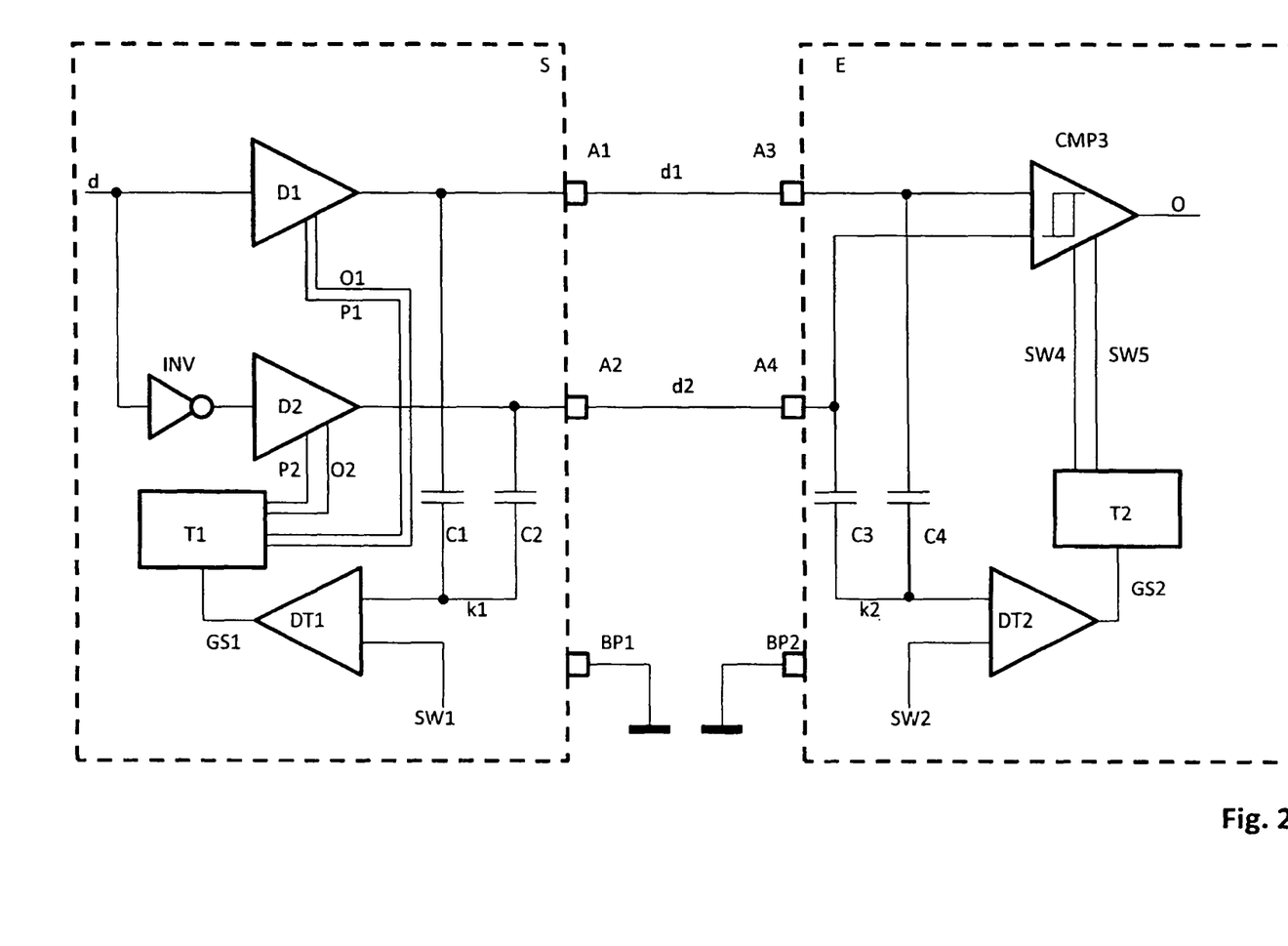

According to FIG. 2, by the receiver, a first logical value is assigned to voltage differences above an upper reception threshold SW5 of the Schmitt trigger CMP3 on the receiver side. Conversely, a second logical value that is inverse to the logical value is assigned to voltage differences below a lower reception threshold SW4 of the Schmitt trigger CMP3 on the receiver side.

The first common-mode detector DT1 compares the detected amount of the first common-mode signal k1 to a first threshold value SW1 and generates a first signal for the common-mode voltage swing GS1. Instead of the comparison with a first threshold value SW1, the common-mode swing can be compared to a first threshold value range, i.e. it can be examined whether the common-mode voltage swing is larger than an upper limiting value or smaller than a lower limiting value of the first threshold value range.

A first partial device T1 evaluates the signal for the first common-mode voltage swing GS1 and increases the first voltage level P1 by which the first driver D1 of the transmitter S drives the first data bus line d1, if the amount of the first common-mode voltage swing on the first common-mode signal k1 is larger than this first threshold value SW1. The first partial device T1 evaluates the signal for the first common-mode voltage swing GS1 and increases the second voltage level P2 by which the second driver D2 of the transmitter S drives the second data bus line d2, if this amount of the first common-mode voltage swing on the first common-mode signal k1 is larger than this first threshold value SW1.

The second common-mode detector DT2 compares the detected amount of the second common-mode signal k2 to a second threshold value SW2 and generates a second signal for the common-mode voltage swing GS2. Instead of the comparison with a second threshold value SW2, the common-mode swing can be compared to a second threshold value range, i.e. it can be examined whether the common-mode voltage swing is larger than an upper limiting value or smaller than a lower limiting value of the second threshold value range.

A second partial device T2 evaluates the signal for the second common-mode voltage swing GS2 and increases the upper reception value SW5 of the Schmitt trigger CMP2 on the receiver side if the amount of the second common-mode voltage swing on the second common-mode signal k2 is larger than this second threshold value SW2. The second partial device T2 evaluates the signal for the second common-mode voltage swing GS2 and decreases the lower reception threshold SW4 of the Schmitt trigger CMP2 on the receiver side if this amount of the common-mode voltage swing on the second common-mode signal k2 is larger than this second threshold value SW2.

According to a particular variant of the invention, the comparison of the amount of the detected first common-mode voltage swing on the first common-mode signal k1 to a first threshold value SW1 is performed, too. If the amount of the first common-mode voltage swing on the first common-mode signal k1 is larger than the first threshold value SW1, there is then performed, in this special variant, an increase of the first offset O1 by which the first driver D1 of the transmitter S drives the first data bus line d1 of the two-wire data bus Z, or an increase of the second offset O2 by which the second driver D2 of the transmitter S drives the second data bus line d2 of the two-wire data bus Z.

According to a further variant of the method for transmission of data d, there is performed a transmission of a data value from the transmitter S to the receiver E that is dependent on the result of the comparison of the amount of the detected first common-mode voltage swing on the first common-mode signal k1 to the first threshold value SW1. For this purpose, e.g. a microcontroller can read this result via a register and, by means of the two-wire data bus Z, describe a register in the receiver. Within the receiver E, there is then performed an increase of the third threshold value SW3 if this amount of the first common-mode swing on the first common-mode signal k1 is larger than the first threshold value SW1. In as far as no individual threshold value is used but, instead, a Schmitt trigger with two threshold values, there will be performed e.g. an increase of the upper reception threshold SW4 and/or optionally a decrease of the lower reception threshold SW3 if this amount of the first common-mode swing on the first common-mode signal k1 is larger than the first threshold value SW1.

The advantage achieved by the invention is now to be seen in that, in case of a too large common-mode alternating voltage on the bus against ground, the negative effect of the amplitude of the common-mode alternating voltage is reduced in the system itself because the amplitude of the common-mode alternating voltage is decreased relative to the useful signal.

The invention can be further described, by way of alternative, by any one of the groups of features mentioned hereunder, wherein the groups of features can be combined with each other as desired and, further, individual features of a group of features can be combined with any one or a plurality of features of any one or a plurality of groups of features and/or with any one or a plurality of the above described variants.

1. Method for transmission of data d by means of digital voltage signals via a two-wire data bus Z in an automobile from a transmitter S comprising a first connecting point A1 of a first data bus line d1 of the two-wire data bus Z and a second connecting point A2 of a second data bus line d2 of the two-wire data bus Z, and a first reference potential connecting point BP1, to a receiver E comprising a third connecting point A3 of the first data bus line d1 of the two-wire data bus Z and a fourth connecting point A4 of the second data bus line d2 of the two-wire data bus Z, and a second reference potential connecting point BP2, comprising the steps of:
    detection of the first common-mode voltage swing at the first connecting point A1 and the second connecting point A2 relative to the first reference potential connecting point BP1, and forming a first common-mode signal k1;
    detection of the second common-mode voltage swing at the third connecting point A3 and the fourth connecting point A4 relative to the second reference potential connecting point BP2, and forming a second common-mode signal k2,
    transmission of data d by the transmitter S by means of a digital voltage signal between first connecting point A1 and the second connecting point A2 via the two-wire data bus Z with a differential transmission level,
    wherein a first driver D1 drives the first data line d1 with a first offset O1 and a first voltage level P1, and
    wherein a second driver D2 drives the second data line d2 with a second offset O2 and a second voltage level P2, and
    wherein the differential transmission level is the difference of the first voltage level P1 and the second voltage level P2;
    reception of the data by the receiver E by detection of the voltage differences between the third connecting point A3 and the fourth connecting point A4;
    comparison of said voltage difference existing between the third connecting point A3 and the fourth connecting point A4
        to a third threshold value SW3, wherein a first logical value is assigned to voltage differences above said third threshold value SW3, and a second logical value that is inverted to the first logical value is assigned to voltage differences below said third threshold value SW3,
        to a lower reception threshold SW4, wherein, in case of voltage differences below said lower reception threshold SW4, an output O of a partial device CMP2 performing the comparison assumes a first level having a first logical value assigned to it, and comparison of said voltage difference to an upper reception threshold SW5, wherein, in case of voltage differences above said upper reception threshold SW5, an output O of a partial device CMP2 performing the comparison assumes a second level having a second logical level assigned to it that is complementary to the first logical value;
    comparison of the amount of the formed first common-mode signal k1 to a first threshold value SW1 and increasing the differential transmission level if said amount of the first common-mode signal k1 is larger than said first threshold value SW1;
    comparison of the amount of the formed second common-mode signal k2 to a second threshold value SW2, and increasing the third threshold value SW3 if said amount of the second common-mode signal s2 is larger than said second threshold value SW2, and increasing the upper reception threshold SW5 and decreasing the lower reception threshold SW4 if said amount of the second common-mode signal k2 is larger than said second threshold value SW2.

2. Method for transmission of data d according to Item 1, comprising the step of:

comparison of the amount of the formed first common-mode signal k1 to a first threshold value SW1 and increasing the first offset O1 with which the first driver D1 of the transmitter S drives the first data bus line d1 of the two-wire data bus Z, and/or increasing the second offset O2 with which the second driver D2 of the transmitter S drives the second data bus line d2 of the two-wire data bus Z if said amount of the formed first common-mode signal k1 is larger than the first threshold value SW1.

3. Method for transmission of data d according to Item 1 or 2, comprising the step of:

transmission of a data value from the transmitter S to the receiver E that is dependent on the result of the comparison of the amount of the formed first common-mode signal k1 to a first threshold value SW1, and increasing the third threshold value SW3 if said amount of the formed first common-mode signal k1 is larger than said first threshold value SW1, and increasing the upper reception threshold SW5 and decreasing the lower reception threshold SW4 if said amount of the first common-mode signal k1 is larger than said first threshold value SW1.

4. Method for transmission of data d by means of digital voltage signals via a two-wire data bus Z in an automobile from a transmitter S comprising a first connecting point A1 of a first data bus line d1 of the two-wire data bus Z and a second connecting point A2 of a second data bus line d2 of the two-wire data bus Z, and a first reference potential connecting point BP1, to a receiver E comprising a third connecting point A3 of the first data bus line d1 of the two-wire data bus Z and a fourth connecting point A4 of the second data bus line d2 of the two-wire data bus Z, and a second reference potential connecting point BP2, comprising the steps of:

detection of the first common-mode voltage swing at the first connecting point A1 and the second connecting point A2 relative to the first reference potential connecting point BP1, and forming a first common-mode signal k1;

detection of the second common-mode voltage swing at the third connecting point A3 and the fourth connecting point A4 relative to the second reference potential connecting point BP2, and forming a second common-mode signal k2, transmission of data d by the transmitter S by means of a digital voltage signal between first connecting point A1 and the second connecting point A2 via the two-wire data bus Z with a differential transmission level, wherein a first driver D1 drives the first data line d1 with a first offset O1 and a first voltage level P1, and wherein a second driver D2 drives the second data line d2 with a second offset O2 and a second voltage level P2, and wherein the differential transmission level is the difference of the first voltage level P1 and the second voltage level P2;

reception of the data by the receiver E by detection of the voltage differences between the third connecting point A3 and the fourth connecting point A4;

comparison of said voltage difference between the third connecting point A3 and the fourth connecting point A4 to a third threshold value SW3, wherein a first logical value is assigned to voltage differences above said third threshold value SW3, and a second logical value that is inverted to the first logical value is assigned to voltage differences below said third threshold value SW3, to a lower reception threshold SW4, wherein, in case of voltage differences below said lower reception threshold SW4, an output O of a partial device CMP2 performing the comparison assumes a first level having a first logical value assigned to it, and comparison of said voltage difference to an upper reception threshold SW5, wherein, in case of voltage differences above said upper reception threshold SW5, an output O of a partial device CMP2 performing the comparison assumes a second level having a second logical level assigned to it that is complementary to the first logical value;

comparison of the amount of the formed first common-mode signal k1 to a first threshold value SW1 and increasing the differential transmission level if said amount of the first common-mode signal k1 is larger than said first threshold value SW1;

comparison of the amount of the formed second common-mode signal k2 to a second threshold value SW2, and increasing the third threshold value SW3 if said amount of the second common-mode signal s2 is larger than said second threshold value SW2, and increasing the upper reception threshold SW5 and decreasing the lower reception threshold SW4 if said amount of the second common-mode signal k2 is larger than said second threshold value SW2;

comparison of the amount of the formed first common-mode signal k1 to a first threshold value SW1 and increasing the first offset O1 with which the first driver D1 of the transmitter S drives the first data bus line d1 of the two-wire data bus Z, and/or increasing the second offset O2 with which the second driver D2 of the transmitter S drives the second data bus line d2 of the two-wire data bus Z if said amount of the formed first common-mode signal k1 is larger than the first threshold value SW1.

5. Method for transmission of data d by means of digital voltage signals via a two-wire data bus Z in an automobile from a transmitter S comprising a first connecting point A1 of a first data bus line d1 of the two-wire data bus Z and a second connecting point A2 of a second data bus line d2 of the two-wire data bus Z, and a first reference potential connecting point BP1, to a receiver E comprising a third connecting point A3 of the first data bus line d1 of the two-wire data bus Z and a fourth connecting point A4 of the second data bus line d2 of the two-wire data bus Z, and a second reference potential connecting point BP2, comprising the steps of:

detection of the first common-mode voltage swing at the first connecting point A1 and the second connecting point A2 relative to the first reference potential connecting point BP1, and forming a first common-mode signal k1 representing the magnitude and respectively the amount of the first common-mode swing;

detection of the second common-mode voltage swing at the third connecting point A3 and the fourth connecting point A4 relative to the second reference potential connecting point BP2, and forming a second common-mode signal k2 representing the magnitude and respectively the amount of the first common-mode swing;

transmission of data d by the transmitter S by means of a digital voltage signal between first connecting point A1 and the second connecting point A2 via the two-wire data bus Z with a differential transmission level,
wherein a first driver D1 drives the first data line d1 with a first offset O1 and a first voltage level P1, and
wherein a second driver D2 drives the second data line d2 with a second offset O2 and a second voltage level P2, and
wherein the differential transmission level is the difference of the first voltage level P1 and the second voltage level P2;

reception of the data by the receiver E by detection of the voltage differences between the third connecting point A3 and the fourth connecting point A4;

comparison of said voltage difference between the third connecting point A3 and the fourth connecting point A4
to a third threshold value SW3, wherein a first logical value is assigned to voltage differences above said third threshold value SW3, and a second logical value that is inverted to the first logical value is assigned to voltage differences below said third threshold value SW3,
to a lower reception threshold SW4, wherein, in case of voltage differences below said lower reception threshold SW4, an output O of a partial device CMP2 performing the comparison assumes a first level having a first logical value assigned to it, and comparison of said voltage difference to an upper reception threshold SW5, wherein, in case of voltage differences above said upper reception threshold SW5, an output O of a partial device CMP2 performing the comparison assumes a second level having a second logical level assigned to it that is complementary to the first logical value;

comparison of the amount of the formed first common-mode signal k1 to a first threshold value SW1 and increasing the differential transmission level if said amount of the first common-mode signal k1 is larger than said first threshold value SW1;

comparison of the amount of the formed second common-mode signal k2 to a second threshold value SW2, and
increasing the third threshold value SW3 if said amount of the second common-mode signal s2 is larger than said second threshold value SW2, and
increasing the upper reception threshold SW5 and decreasing the lower reception threshold SW4 if said amount of the second common-mode signal k2 is larger than said second threshold value SW2;

transmission of a data value from the transmitter S to the receiver E that is dependent on the result of the comparison of the amount of the formed first common-mode signal k1 to a first threshold value SW1, and
increasing the third threshold value SW3 if said amount of the formed first common-mode signal k1 is larger than said first threshold value SW1, and
increasing the upper reception threshold SW5 and decreasing the lower reception threshold SW4 if said amount of the first common-mode signal k1 is larger than said first threshold value SW1.

6. Data bus system for transmission of data d by means of digital voltage signals via a two-wire data bus Z in an automobile from a transmitter S to a receiver E,
wherein the transmitter S comprises a first connecting point A1 of a first data bus line d1 of the two-wire data bus Z, and
wherein the transmitter S comprises a second connecting point A2 of a second data bus line d2 of the two-wire data bus Z, and
wherein the transmitter S comprises a first reference potential connecting point BP1, and
wherein the receiver E comprises a third connecting point A3 of the first data bus line d1 of the two-wire data bus Z, and
wherein the receiver E comprises a fourth connecting point A4 of the second data bus line d2 of the two-wire data bus Z, and
wherein the receiver E comprises a second reference potential connecting point BP2, and
wherein the transmitter S comprises a partial device C1,C2 which detects the first common-mode voltage swing at the first connecting point A1 and the second connecting point A2 relative to the first reference potential connecting point BP1, and generates a first common-mode signal k1, and
wherein the receiver E comprises a partial device C3,C4 which detects the second common-mode voltage swing at the third connecting point A3 and the fourth connecting point A4 relative to the second reference potential connecting point BP2, and generates a second common-mode signal k2,
wherein the transmitter S comprises a first driver D1, which, for transmission of data d by means of a digital differential voltage signal via the two-wire data bus Z, drives the first connecting point A1 having the first data bus line d1 of the two-wire data bus Z connected to it, by means of a signal having a first voltage level P1 and a first offset O1, and
wherein the transmitter S comprises a second driver D2, which, for transmission of data d by means of a digital differential voltage signal via the two-wire data bus Z, drives the second connecting point A2 having the second data bus line d2 of the two-wire data bus Z connected to it, by means of a signal having a second voltage level P2 and a second offset O2, and
wherein the differential transmission level of the digital differential voltage signal is the difference of the first voltage level P1 and the second voltage level P2, and
wherein, in the receiver E, a receiver device CMP2 receives the data d transmitted by the transmitter onto the two-wire data bus Z, by detection of the voltage difference between the third connecting point A3 having the first data bus line d1 connected to it, and the fourth connecting point A4 having the second data bus line d2 connected to it,
wherein said receiver device CMP2 compares the thus detected voltage difference between the third connecting point A3 and the fourth connecting point A4
to a third threshold value SW3, wherein a first logical value is assigned to voltage differences above said third threshold value SW3, and a second logical value that is inverted to the first logical value is assigned to voltage differences below said third threshold value SW3,
to a lower reception threshold SW4, wherein, in case of voltage differences below said lower reception threshold SW4, an output O of a partial device CMP2 performing the comparison assumes a first level having a first logical value assigned to it, and compares said voltage difference to an upper reception threshold SW5, wherein, in case of voltage differences above said upper reception threshold SW5, an output O of a partial device CMP2 performing the comparison assumes a second level having a second logical level assigned to it that is complementary to the first logical value;

wherein the transmitter S comprises a first common-mode detector DT1,T1 which compares the amount of the detected first common-mode voltage swing in the form of a potential of the first common-mode signal k1 to a first threshold value SW1 and increases the differential transmission level by increasing the first voltage level P1 and/or the second voltage level P2 if said amount of the first common-mode voltage swing in the form of a potential of the first common-mode signal k1 is larger than said first threshold value SW1;

wherein the receiver E comprises a second common-mode detector DT2,T2 which compares the amount of the second common-mode voltage swing in the form of a potential of the second common-mode signal k2 to a second threshold value SW2 and increases the third threshold value SW3 if said amount of the second common-mode voltage swing in the form of the potential of the second common-mode signal k2 is larger than said second threshold value SW2, or increases the upper reception threshold SW5 and/or decreases the lower reception threshold SW4 if said amount of the second common-mode voltage swing in the form of the potential of the second common-mode signal k2 is larger than said second threshold value SW2.

LIST OF REFERENCE NUMERALS

A1 first connecting point of the transmitter S for the first data bus line d1
A2 second connecting point of the transmitter S for the second data bus line d2
A3 third connecting point of the receiver E for the first data bus line d1
A4 fourth connecting point of the receiver E for the second data bus line d2
BP1 first reference potential connecting point of the transmitter S. The distribution of the reference potential within the transmitter S is familiar to the person skilled in the art and thus is not specifically illustrated in FIG. 1.
BP2 first reference potential connecting point of the receiver E. The distribution of the reference potential within the receiver E is familiar to the person skilled in the art and thus is not specifically illustrated in FIG. 1.
C1 first capacitor
C2 second capacitor
C3 third capacitor
C4 fourth capacitor
CMP1 transmitter-side comparator
CMP2 receiver-side comparator
CMP3 Schmitt trigger of the receiver E
d transmission data (input)
d1 first data bus line
d2 second data bus line
D1 first driver of the transmitter S that drives the first data bus line d1 of the two-wire data bus Z
D2 second driver of the transmitter S that drives the second data bus line d2 of the two-wire data bus Z
DT1 first common-mode detector
DT2 second common-mode detector
E receiver
INV inverter
GS1 first signal for the first common-mode voltage swing on the first common-mode signal k1 on the side of the transmitter S
GS2 second signal for the second common-mode voltage swing on the second common-mode signal k2 on the side of the receiver E
k1 first common-mode signal on the side of the transmitter S
k2 second common-mode signal on the side of the receiver E
O output of the Schmitt trigger with useful data
O1 first offset
O2 second offset
P1 first voltage level by which the first driver D1 of the transmitter S drives the first data bus line d1 of the two-wire data bus Z
P2 second voltage level by which the second driver D2 of the transmitter S drives the second data bus line d2 of the two-wire data bus Z
S transmitter
SW1 first threshold value
SW2 second threshold value
SW3 third threshold value
SW4 lower reception threshold of the Schmitt trigger CMP3 of the receiver E
SW5 upper reception threshold of the Schmitt trigger CMP3 of the receiver E
T1 first partial device
T2 second partial device
Z two-wire data bus

The invention claimed is:

1. Method for transmission of data by digital voltage signals via a two wire data bus of a vehicle from a transmitter to a receiver under influence of common-mode interferences acting on the two-wire data bus,
   wherein the two-wire data bus comprises a first data bus line and a second data bus line,
   wherein the transmitter comprises a first connecting point connected to the first data bus line and a second connecting point connected to the second data bus line, and a first reference potential connecting point,
   wherein the transmitter comprises a first driver for the first connecting point and a second driver for the second connecting point, and
   wherein the receiver comprises a third connecting point connected to the first data bus line and a fourth connecting point connected to the second data bus line, and a second reference potential connecting point,
   comprising:
   a) detection of a first common-mode voltage swing at the first and the second connecting point of the transmitter relative to the first reference potential connecting point, and forming a first common-mode signal,
   b) transmission of data by the transmitter via the two-wire data bus to the receiver by applying, between the first and the second connecting point of the transmitter, a digital voltage signal having a differential transmission level,
      i) wherein the first driver drives the first data line with a first offset and a first voltage level,
      ii) wherein the second driver drives the second data line with a second offset and a second voltage level, and
      iii) wherein the differential transmission level is the difference of the first voltage level and the second voltage level, c) reception of the data by the receiver by detection of the voltage differences between the third connecting point and the fourth connecting point of the receiver, and
d) comparison of the amount of the detected first common-mode voltage swing to a first threshold value and increasing the differential transmission level if the amount of the first common-mode voltage swing is larger than the first threshold value.

2. Method for transmission of data by digital voltage signals via a two-wire data bus of a vehicle from a transmitter to a receiver under influence of common-mode interferences acting on the two-wire data bus,
wherein the two-wire data bus comprises a first data bus line and a second data bus line,
wherein the transmitter comprises a first connecting point connected to the first data bus line and a second connecting point connected to the second data bus line, and a first reference potential connecting point, and
wherein the receiver comprises a third connecting point connected to the first data bus line and a fourth connecting point connected to the second data bus line, and a second reference potential connecting point,
comprising:
a) detection of a second common-mode voltage swing at the third and the fourth connecting point of the receiver relative to the second reference potential connecting point, and forming a second common-mode signal,
b) transmission of data by the transmitter via the two-wire data bus to the receiver by applying, between the first and the second connecting point of the transmitter, a digital voltage signal for generating voltage differences between the connecting points,
c) reception of the data by the receiver by detection of the voltage differences between the third connecting point and the fourth connecting point of the receiver,
d) comparison of the voltage differences existing between the third and the fourth connecting point of the receiver to a third threshold value, wherein a first logical value is assigned to voltage differences above said third threshold value, and a second logical value that is inverted to the first logical value is assigned to voltage differences below said third threshold value, and
e) comparison of the amount of the detected second common-mode voltage swing to a second threshold value and increasing the third threshold value if the amount of the second common-mode voltage swing is larger than the second threshold value.

3. Method for transmission of data by digital voltage signals via a two-wire data bus of a vehicle from a transmitter to a receiver under influence of common-mode interferences acting on the two-wire data bus,
wherein the two-wire data bus comprises a first data bus line and a second data bus line,
wherein the transmitter comprises a first connecting point connected to the first data bus line and a second connecting point connected to the second data bus line, and a first reference potential connecting point,
wherein the transmitter comprises a first driver for the first connecting point and a second driver for the second connecting point, and
wherein the receiver comprises a third connecting point connected to the first data bus line and a fourth connecting point connected to the second data bus line, and a second reference potential connecting point,
comprising:
a) detection of a first common-mode voltage swing at the first and the second connecting point of the transmitter relative to the first reference potential connecting point, and forming a first common-mode signal,
b) detection of a second common-mode voltage swing at the third and the fourth connecting point of the receiver relative to the second reference potential connecting point, and forming a second common-mode signal,
c) transmission of data by the transmitter via the two-wire data bus to the receiver by applying, between the first and the second connecting point of the transmitter, a digital voltage signal having a differential transmission level,
  i) wherein the first driver drives the first data line with a first offset and a first voltage level,
  ii) wherein the second driver drives the second data line with a second offset and a second voltage level, and
  iii) wherein the differential transmission level is a difference of the first voltage level and the second voltage level,
d) reception of the data by the receiver by detection of voltage differences between the third connecting point and the fourth connecting point of the receiver,
e) comparison of the voltage differences existing between the third connecting point and the fourth connecting point of the receiver to a third threshold value, wherein a first logical value is assigned to the voltage differences between the third and the fourth connecting point above said third threshold value, and a second logical value that is inverted to the first logical value is assigned to the voltage differences between the third and the fourth connecting point below said third threshold value,
f) comparison of the amount of the detected first common-mode voltage swing to a first threshold value and increasing the differential transmission level if the amount of the first common-mode voltage swing is larger than the first threshold value,
g) comparison of the amount of the detected second common-mode voltage swing to a second threshold value and increasing the third threshold value if the amount of the second common-mode voltage swing is larger than the second threshold value, and
h) transmission of a data value from the transmitter to the receiver that is dependent on the result of the comparison of the amount of the detected first common-mode voltage swing to the first threshold value, and increasing the third threshold value if the amount of the first common-mode voltage swing is larger than the first threshold value.

4. Method for transmission of data by digital voltage signals via a two-wire data bus of a vehicle from a transmitter to a receiver under influence of common-mode interferences acting on the two-wire data bus,
wherein the two-wire data bus comprises a first data bus line and a second data bus line,
wherein the transmitter comprises a first connecting point connected to the first data bus line and a second connecting point connected to the second data bus line, and a first reference potential connecting point,
wherein the receiver comprises a third connecting point connected to the first data bus line and a fourth connecting point connected to the second data bus line, and a second reference potential connecting point,
comprising:
a) detection of a second common-mode voltage swing at the third and the fourth connecting point of the receiver relative to the second reference potential connecting point, and forming a second common-mode signal, b) transmission of data by the transmitter via the two-wire data bus to the receiver by applying, between the first connecting point and the second connecting point of the transmitter, a digital voltage signal for generating voltage differences between the first connecting point and the second connecting point, c) reception of the data by the receiver by detection of voltage differences between the third connecting point and the fourth connecting point of the receiver, d) comparison of the voltage differences between the third connecting point and the fourth connecting point of the receiver to a lower reception threshold, wherein, in case of the voltage differences between the third connecting point and the fourth connecting point below said lower reception threshold, an output of a partial device performing the comparison assumes a first level having a first logical value assigned to it, and to an upper reception threshold, wherein, in case of the voltage differences between the third connecting point and the fourth connecting point above said upper reception threshold, the output of the partial device performing the comparison assumes a second level having a second logical level assigned to it that is complementary to the first logical value, e) comparison of the amount of the detected second common-mode voltage swing to a second threshold value and increasing the upper reception threshold and decreasing the lower reception threshold if the amount of the second common-mode voltage swing is larger than the second threshold value.

5. Method for transmission of data by digital voltage signals via a two-wire data bus of a vehicle from a transmitter to a receiver under influence of common-mode interferences acting on the two-wire data bus, wherein the two-wire data bus comprises a first data bus line and a second data bus line, wherein the transmitter comprises a first connecting point connected to the first data bus line and a second connecting point connected to the second data bus line, and a first reference potential connecting point, wherein the transmitter comprises a first driver for the first connecting point and a second driver for the second connecting point, and wherein the receiver comprises a third connecting point connected to the first data bus line and a fourth connecting point connected to the second data bus line, and a second reference potential connecting point, comprising:

a) detection of a first common-mode voltage swing at the first and the second connecting point of the transmitter relative to the first reference potential connecting point, and forming a first common-mode signal, b) detection of a second common-mode voltage swing at the third and the fourth connecting point of the receiver relative to the second reference potential connecting point, and forming a second common-mode signal, c) transmission of data by the transmitter via the two-wire data bus to the receiver by applying, between the first and the second connecting point of the transmitter, a digital voltage signal having a differential transmission level,
  i) wherein the first driver drives the first data line with a first offset and a first voltage level,
  ii) wherein the second driver drives the second data line with a second offset and a second voltage level, and
  iii) wherein the differential transmission level is a difference of the first voltage level and the second voltage level, d) reception of the data by the receiver by detection of voltage differences between the third connecting point and the fourth connecting point of the receiver, e) comparison of the voltage differences between the third connecting point and the fourth connecting point of the receiver to a lower reception threshold, wherein, in case of the voltage differences between the third connecting point and the fourth connecting point below said lower reception threshold, an output of a partial device performing the comparison assumes a first level having a first logical value assigned to it, and to an upper reception threshold, wherein, in case of the voltage differences between the third connecting point and the fourth connecting point above said upper reception threshold, the output of the partial device performing the comparison assumes a second level having a second logical level assigned to it that is complementary to the first logical value, f) comparison of the amount of the detected first common-mode voltage swing to a first threshold value and increasing the differential transmission level if the amount of the first common-mode voltage swing is larger than the first threshold value, g) comparison of the amount of the detected second common-mode voltage swing to a second threshold value and increasing the upper reception threshold and decreasing the lower reception threshold if the amount of the second common-mode voltage swing is larger than the second threshold value, and h) transmission of a data value from the transmitter to the receiver that is dependent on the result of the comparison of the amount of the detected first common-mode voltage swing to the first threshold value, and increasing the upper reception threshold and decreasing the lower reception threshold if the amount of the first common-mode voltage swing is larger than the first threshold value.

* * * * *